(12) United States Patent
Niggemeyer et al.

(10) Patent No.: US 11,100,389 B2
(45) Date of Patent: Aug. 24, 2021

(54) CONVERSION OF DIGITAL SIGNALS INTO SPIKING ANALOG SIGNALS

(71) Applicant: ELECTRONIC WARFARE ASSOCIATES, INC., Herndon, VA (US)

(72) Inventors: Dirk Niggemeyer, Shrewsbury, MA (US); Lester A. Foster, III, Frederick, MD (US)

(73) Assignee: ELECTRONIC WARFARE ASSOCIATES, INC., Herndon, VA (US)

(*) Notice: Subject to any disclaimer, the term of this patent is extended or adjusted under 35 U.S.C. 154(b) by 500 days.

(21) Appl. No.: 16/180,999

(22) Filed: Nov. 5, 2018

(65) Prior Publication Data

US 2019/0138884 A1 May 9, 2019

Related U.S. Application Data

(60) Provisional application No. 62/581,969, filed on Nov. 6, 2017.

(51) Int. Cl.
*G06N 3/04* (2006.01)
*H03M 1/66* (2006.01)
*H03M 1/74* (2006.01)
*G06N 3/08* (2006.01)

(52) U.S. Cl.
CPC ............. *G06N 3/049* (2013.01); *H03M 1/66* (2013.01); *H03M 1/745* (2013.01); *G06N 3/08* (2013.01)

(58) Field of Classification Search
CPC ........ G06N 3/049; G06N 3/08; G06N 3/0635; H03M 1/745; H03M 1/66
See application file for complete search history.

(56) References Cited

U.S. PATENT DOCUMENTS

| | | | | |
|---|---|---|---|---|
| 6,262,678 B1 * | 7/2001 | Sarpeshkar | ........... | H03M 1/164 341/110 |
| 8,595,157 B2 * | 11/2013 | Cruz-Albrecht | ....... | G06N 3/063 706/12 |
| 9,129,220 B2 * | 9/2015 | Aparin | ................... | G06N 3/088 |

* cited by examiner

*Primary Examiner* — Brian K Young
(74) *Attorney, Agent, or Firm* — DLA Piper LLP US

(57) ABSTRACT

A digital signal may be converted into a spiking analog signal. A different constant current may be applied to each of a plurality of switch circuits. Each bit of the digital signal may be applied to a corresponding one of the plurality of switch circuits. Each switch circuit may apply the corresponding constant current to a common output when the corresponding bit has a predetermined value. Each switch circuit may not apply the corresponding constant current to the common output when the corresponding bit does not have the predetermined value. A common current may be applied at the common output to a spiking neuron circuit.

14 Claims, 7 Drawing Sheets

CONVERSION OF DIGITAL SIGNALS INTO SPIKING ANALOG SIGNALS

CROSS-REFERENCE TO RELATED APPLICATIONS

This application is based on and derives the benefit of the filing date of U.S. Patent Application No. 62/581,969, filed Nov. 6, 2017. The entire content of this application is herein incorporated by reference in its entirety.

GOVERNMENT CONTRACT INFORMATION

This invention was made with Government support under Contract No. W15QKN-14-C-20140904 awarded by the U.S. Government as represented by the Secretary of the Army. The Government has certain rights in the invention.

FIELD

The present invention relates generally to the technical field of electronic circuits. More particularly, the present invention relates to the conversion of digital signals into analog signals.

BACKGROUND

As is known in the art, digital-to-analog converters (DACs) have been used in a wide variety of applications to convert an N-bit digital signal into a corresponding analog signal. Artificial neural networks (ANNs) that use spiking analog signals for communication between individual neuron circuits, are known for their low power consumption and their low circuit complexity compared to artificial neural networks using digital logic for implementing the network components.

Digital images, i.e., one or more still image or sequences of images, such as a video streams, often are digitally encoded as red-green-blue (RGB) images. Each RGB image consists of a large number of pixels, and each pixel data consists of, e.g., 8 bits of data for the color red, representing 256 red values, 8 bits of data for the color green, representing 256 green values, and 8 bits of data for blue, representing 256 blue values, for a total of 24 bits per image pixel.

Digital processing typically uses variations of convolutional neural networks that consist of a plurality of network layers. The individual network layers have different functions, and therefore, result in different circuitry, connectivity, and topology. For example, a convolutional network without storage elements, i.e., a network that evaluates only the current input signals with disregard to any previous input signals, consists of sampling layers, convolutional layers, and one or more output layers. One well-known example is the feedforward convolutional network style named "LeNet" and its various slightly different implementations by main author Yann LeCun and other research groups.

SUMMARY

Disclosed herein is a method of converting a digital signal into a spiking analog signal. A different constant current is applied to each of a plurality of switch circuits. Each bit of the digital signal is applied to a corresponding one of the plurality of switch circuits. Each switch circuit applies the corresponding constant current to a common output when the corresponding bit has a predetermined value and does not apply the corresponding constant current to the common output when the corresponding bit does not have the predetermined value. A common current at the common output is applied to a spiking neuron circuit.

DETAILED DESCRIPTION OF DISCLOSED EMBODIMENTS

Figure 1:
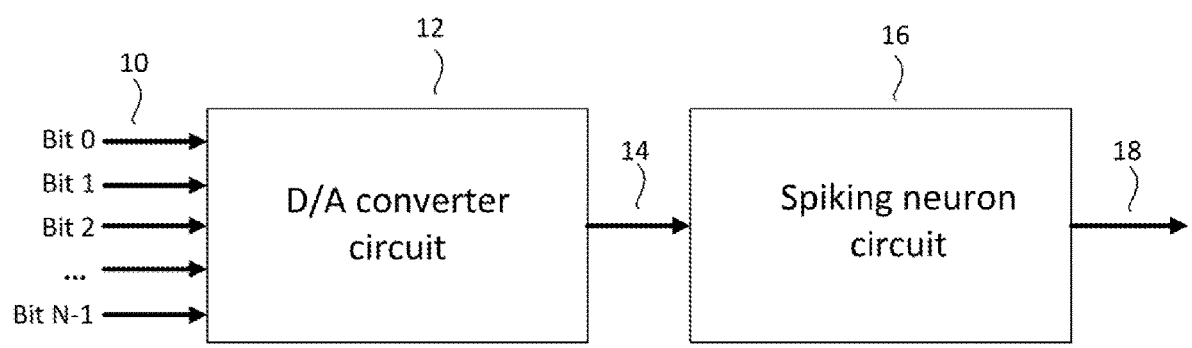
FIG. 1 is a high-level block diagram of the present invention, showing one digital-to-analog converter circuit and one spiking neuron circuit.

Referring to FIG. 1 there is shown a DAC circuit 12 having a number of digital inputs 10 and at least one analog output, and a spiking neuron circuit 16, having an analog signal input and an analog output 18. The output of the converter 12 and the input of the neuron 16 may be connected through wire 14.

In more detail, the number of digital inputs 10 may be any integer number that is equal to or higher than one. The DAC 12 may interpret the digital signal applied to the N inputs as an N-bit signal value and generate an analog current, which is proportional to the N-bit input signal, at the output of converter 12.

Wire 14 may provide a current to the input of spiking neuron 16. Once a sufficient amount of current flows through 14 into 16, the neuron 16 may generate a waveform at its output 18 that resembles a spiking waveform.

Figure 2:
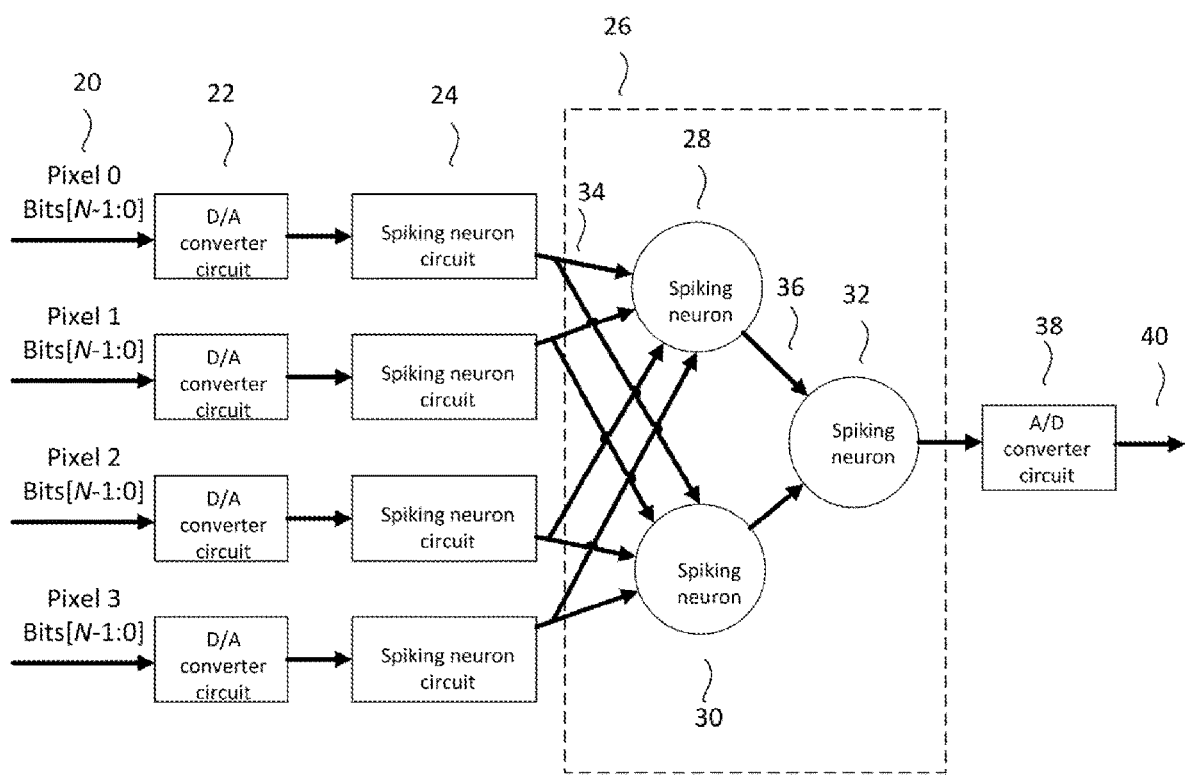
FIG. 2 is a diagram showing multiple instances of the present invention being part of an example of an Artificial Neural Network (ANN) circuit that is composed of four N-bit digital-to-analog converter (ADC) circuits, four spiking neurons with analog inputs as the first network layer, two fully connected spiking neurons as the intermediate network layer, one fully connected spiking neuron as the output layer of the network, and one analog-to-digital converter circuit (DAC) that converts the spiking signal into a digital output signal of one or more bits.

FIG. 2 is an example diagram showing how multiple instances of the invention of FIG. 1 may be connected to a multi-layer neural network 26. Each of the four spiking neuron circuits 24 may act as an input layer neuron of the network and may be connected to one or more spiking neurons 28 and 30 of the intermediate network layer. It is known in the art that the connections 34 and 36 between the network layers may implement weighting functions, also referred to as weights, assigning unique weights for each connection between the outputs of spiking neurons 24 and neurons 28 and 30.

The outputs of neurons 28 and 30 may be connected to an output layer neuron 32 of network 26 through the weighted connections 36. The output of spiking neuron 32 may be connected to an analog-to-digital converter circuit 38 that provides a digital signal 40 at its output for consumption of connected digital logic.

Figure 3:
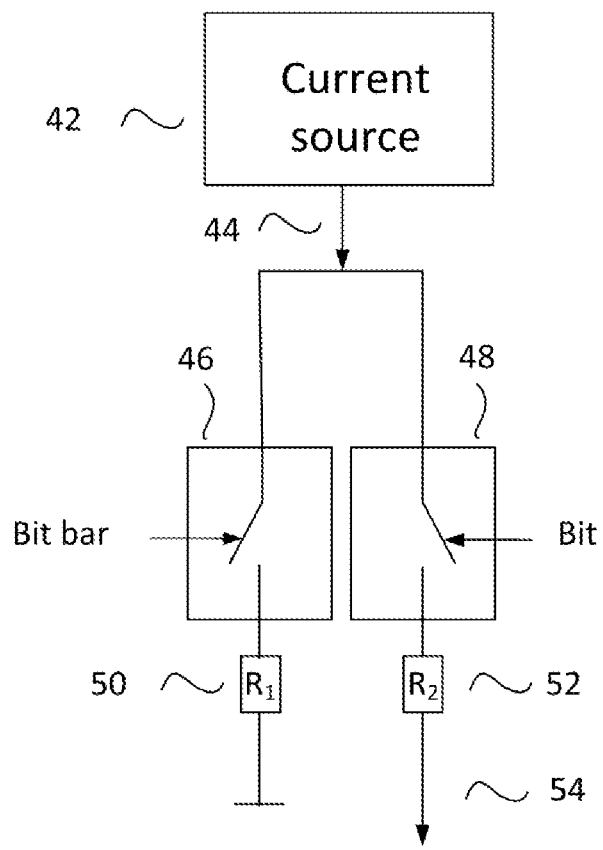
FIG. 3 is a diagram of a one-bit slice of the digital-to-analog converter circuit.

Referring now to the circuit shown in FIG. 3, which is a component of the DAC block 12 of FIG. 1, a current source 42 may provide a constant current on wire 44 to the two conducting path through the switches 46 and 48, which are controlled by a single digital input value "Bit" from 10 and its inverted value "Bit bar." If switch 46 is on, the entire current from source 42 may flow through resistor 50 to the common ground connection of the circuit. If switch 48 is activated, the current from source 42 may flow through resistor 52 into node 54 instead.

Figure 4:
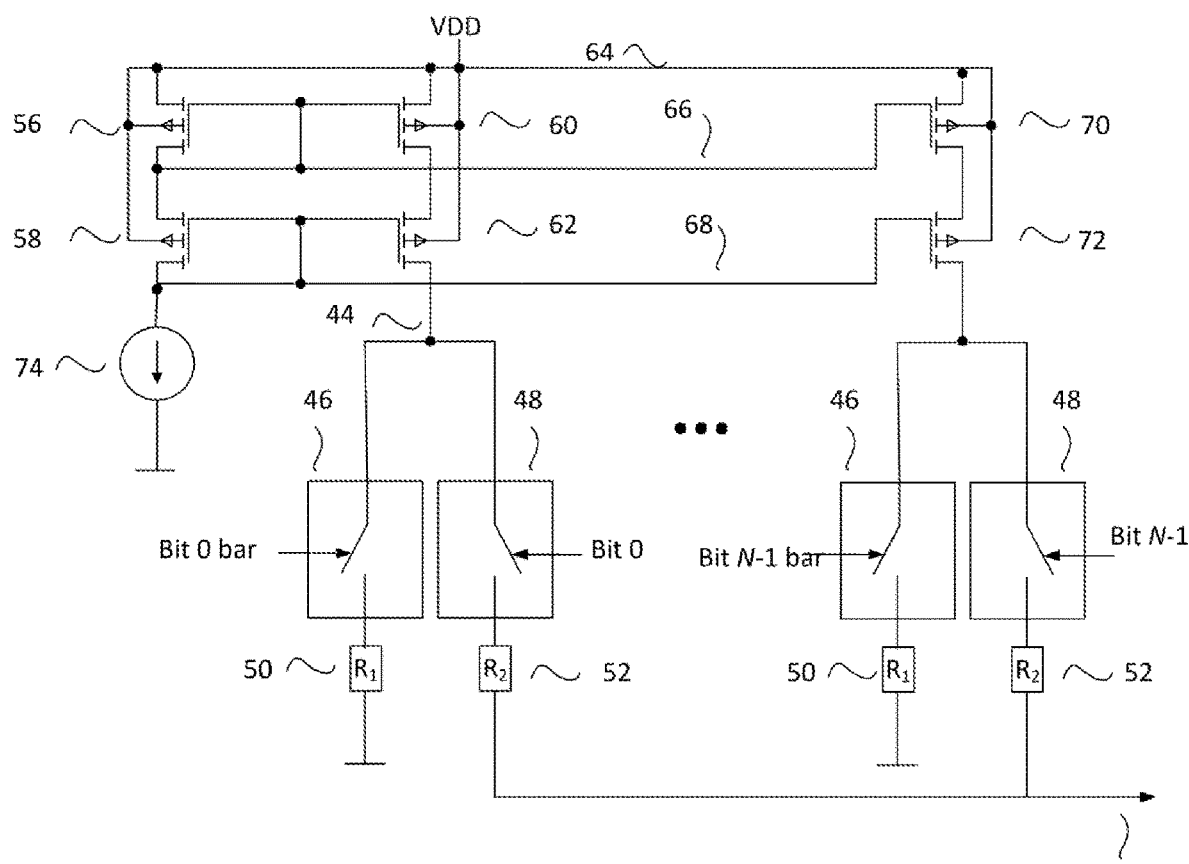
FIG. 4 is a diagram of a multitude of one-bit digital-to-analog converter circuits that add up their output currents at the output node 14.

FIG. 4 represents a multitude of circuits as shown in FIG. 3 to implement an N-bit DAC with N being an integer number of 1 or higher. The outputs of switches 46 that are controlled by inverted input signals, may be connected over resistances 50 to the common ground node of the circuit. The outputs of switches 48, in FIG. 3 node 54 and shown here in FIG. 4, which are controlled by the non-inverted input signals, such as "Bit 0" and "Bit N−1" may be connected through net 14 and fed to the output pin of DAC logic.

It is known to those skilled in the art that resistors 50 and 52 may alternatively be implemented as a multitude of transistors by biasing the transistor gates such that the transistors act as devices with a constant resistance.

FIG. 4 also illustrates a current mirror circuit used as the common current source for each branch of the DAC. A very small constant current in the nano-ampere to micro-ampere range may be drawn from the current source 74 and may flow through transistors 56 and 58. It is known to those skilled in the art that two major parameters of field effect transistors (FETs), such as 56 and 58, may be the dimensions of the conducting channel. The dimensions may be defined by the width "W" of the channel and length "L" of the channel. As is further known to those skilled in the art, the usual way of describing the channel dimensions may be by defining the ratio of the width to the length of the channel as "W/L". An increase in the width may reduce the channel resistance, while an increase in the length of the channel may increase the channel resistance.

The pair of transistors 56 and 58 may build a current mirror circuit with transistors 60 and 62. In an example implementation in a 65 nm CMOS technology, the ratio of transistor width to length for node 56 and 58 may be W/L=1, e.g., W=60 nm and L=60 nm. It is known to those skilled in the art that if the transistor width-to-length ratios of 60 and 62 are chosen to be the same as those of 56 and 58 (W/L=1), the resulting current through node 44 may be the same as the current through current source 74.

Transistors 56 and 58 also represent a current mirror with transistors 70 and 72. If, as an example, "N" is chosen to be 2, a 2-bit digital-to-analog converter may be implemented. In that case, the width-to-length ratio of transistors 70 and 72 may be chosen to be W/L=2, so that the current flowing through transistors 70, 72, switch 48 of bit 1, and resistor 52 to node 14 is twice the amount of the current flowing through transistors 60, 62, switch 48 of bit 0 and resistor 52. It is known to those skilled in the art that this D/A circuitry may be extended to more than two input bits by adding bit slices with transistor ratios of W/L=4, W/L=8, and so on, until the desired number of digital input bits is achieved. As an example, using 8-bit digital input data, the width-to-length ratios of transistors 70 and 72 may be W/L=128. It is also known to those skilled in the art that any transistor with a width W that is p times larger than the smallest width used in the design, may be replaced by p transistors, each having a width of W/p.

It is understood for someone skilled in the art that independent of the values that are applied to the N-bit inputs, the total current drawn from current source 74 may be constant.

The transistors 56, 58, 60, 62, 70, and 72 may be implemented as p-channel metal-oxide-semiconductor field-effect transistors (P-MOSFET or PMOS) transistors. The switches 46 and 48 may be implemented as p-channel (PMOS) or n-channel MOSFET (NMOS) or bipolar transistors. In the preferred implementation, all transistors in FIG. 4 may be implemented as PMOS transistors. Also in the preferred implementation, the resistive elements 50 and 52, may be implemented using PMOS transistors.

The constant current drawn from current source may enable an accurate high-speed adjustment of the output current through node 14 and therefore accurate and high-speed analog signaling from the DAC 12 to the spiking neuron circuit 16 of FIG. 1. The drawing of constant amount of current through the entirety of all resistive elements 50 and 52 of FIG. 4, independent of the N-bit digital input data, may allow for a smooth and continuous current flow through node 14 when one or more of the N inputs change their values.

Figure 5:
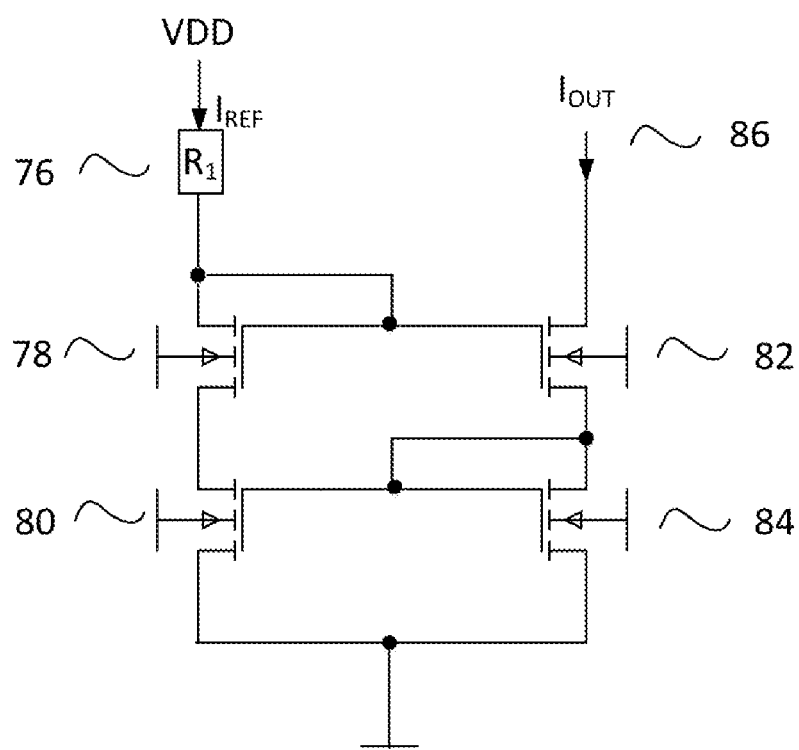
FIG. 5 is a diagram of an example implementation of the current source 74 of FIG. 4.

FIG. 5 represents the circuit implementation of the current source 74 in FIG. 4. It is known to those skilled in the art that the combination of NMOS transistors 78, 80, 82, and 84 may implement a current mirror, such that the constant current through resistor 76 is "mirrored" in the output current on node 86. In one example implementation, where VDD may be set to 1.8V, the resistor 76 may have a value of 270MΩ, and the W/L ratios of transistors are set to 2/1 (e.g., W=240 nm and L=120 nm), the resulting constant current of the current source, when used as in 74 in FIG. 4, may be approximately 5 nA.

Figure 6:
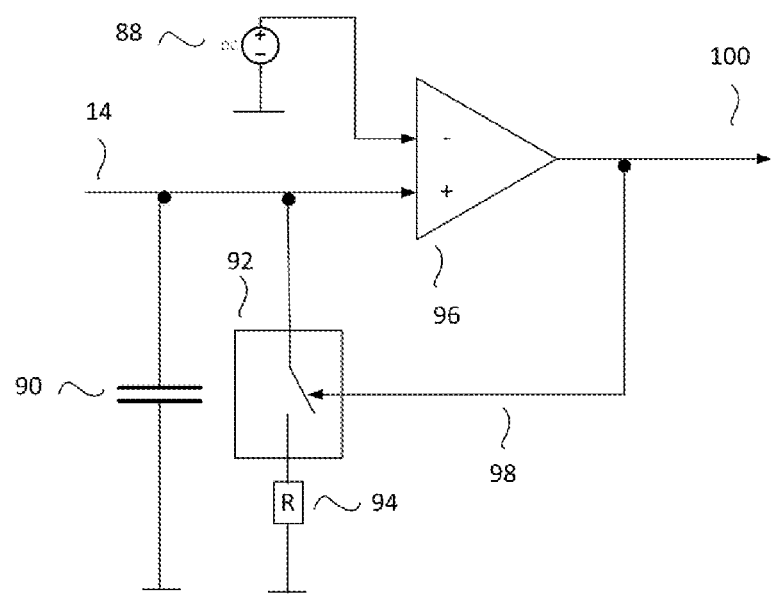
FIG. 6 is a diagram of the circuit of the spiking neuron depicted in FIG. 1.

Referring now to FIG. 6, the spiking neuron circuit block of FIG. 1, may include an input 14, a voltage source 88, capacitor 90, a switch 92, a resistive element 94 connected to one connector of the switch and connected to the ground terminal, a differential amplifier circuit 96, a feedback loop net 98 that controls switch 92, and the output terminal and net 100.

In one implementation, the resistive element 94 may be implemented as an n-channel MOSFET transistor (NMOS).

It is known to those skilled in the art that the differential amplifier 96 may output a positive voltage on net 100 when the input voltage on node 14 exceeds the voltage generated by voltage source 88.

A current entering the circuit at node 14 may charge the capacitor 90 until a certain voltage is reached on node 14 that surpasses the threshold voltage, defined by voltage source 88, needed for the amplifying circuit 96 to change its output value from approximately zero to a voltage close to or identical to the operating voltage of the circuit in FIG. 6. Once the output voltage, and therefore the voltage on node 100, reaches a threshold voltage, switch 92, which is connected to node 100 through net 98, may become conducting and discharges capacitor 76 through resistor 94 towards ground.

It is understood for someone skilled in the art that the process of charging the capacitor 90 by means of a constant current delivered to neuron input 14 may follow a certain time constant. Also known to those skilled in the art is that the resulting waveform on output node 100 may resemble that of a spike. The frequency of spikes emitted from the neuron circuit may be proportional to the current entering the circuit on node 14.

It is understood for someone skilled in the art that the power consumption of the circuit shown in FIG. 6, including the amplifying circuit 96, may be close to zero at all times in which the input signal on node 14 is zero. The circuit shown in FIG. 6 may only consume a measurable amount of power when the input signal on node 14 causes the capacitor 90 to charge to the point that the voltage over capacitor 90 causes the amplifying circuit 96 to output a waveform, thus, causing feedback net 98 and switch 92 to trigger, resulting in a spiking waveform on output 100.

Figure 7:
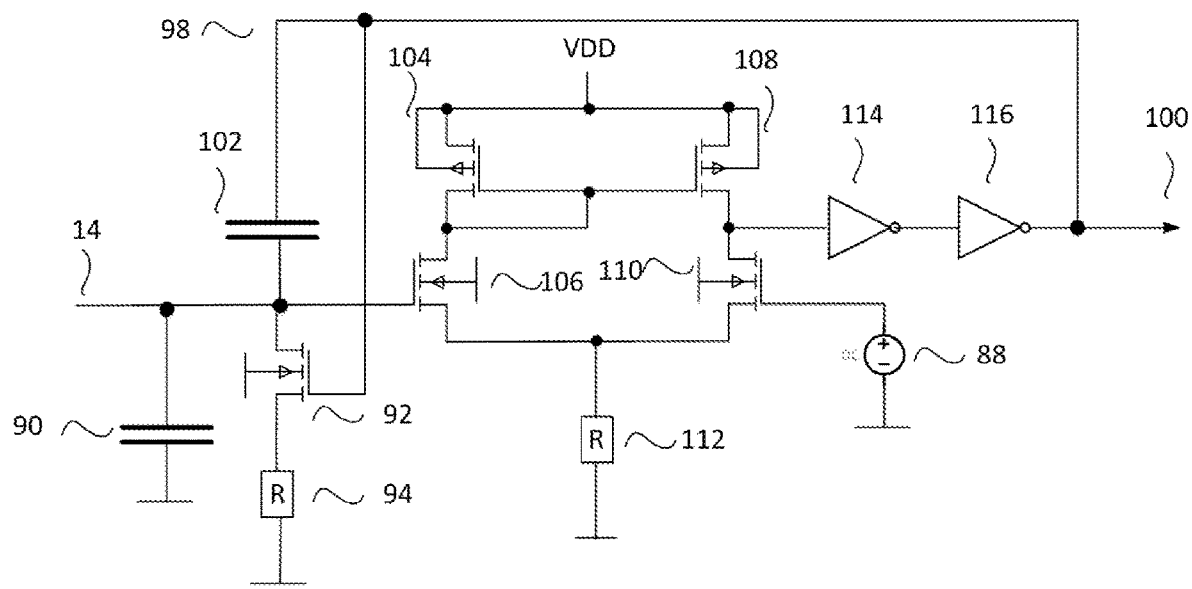
FIG. 7 is an example circuit implementation of the spiking neuron from FIG. 6.

FIG. 7 is an example detailed circuit implementation of the circuit in FIG. 6. In this figure, the differential amplifier circuit 96 of FIG. 6 may be replaced by a comparator circuit, consisting of transistors 104, 106, 108, and 110, and resistive element 112, as well as a pair of inverter circuits 114 and 116. As is known in the art, the pair of inverters 114 and 116 may be used for signal shaping of the spiking signal on output node 100 as well as for driving high loads at output 100.

It is known to someone skilled in the art that the capacitor 102 may provide positive feedback from the output node 100 to the input node 14 of the differential amplifier, causing the voltage on node 14 to increase faster than it would solely through the input current entering the circuit through node 14. Once the voltage on net 98 surpasses a certain value determined by the resistance of 94 and the transistor properties of 92, the capacitor 90 may quickly discharge to ground, the output voltage 100 may return to about zero and the circuit may be ready to charge capacitor 90 again and create another spike at the output 100.

In one example implementation in a 65 nm CMOS technology, the operating voltage VDD may be 1.8V, the capacitances of 90 and 102 may be 5 fF, the width-to-lengths ratios of PMOS transistors 104 and 108 may be 2/1, the width-to-length ratios of NMOS transistors 106 and 110 may be 1/1, the width-to-length ratio of NMOS transistor 92 may be ½, the resistance of 94 may be 1MEGΩ, the resistance of 112 may be 470KΩ, the voltage 88 may be 0.7V, and the inverter circuits 114 and 116 may be implemented as standard CMOS inverters.

The arrangements described herein may enable an accurate conversion of an N-bit digital signal into a spiking analog signal of a given and mostly constant amplitude; further, this conversion may be performed using a minimal amount of power, and even further, the conversion of the digital input signals into analog spiking signals may be possible over a wide range of frequencies. In one example implementation, as shown in FIG. 1, with N=5 input bits, an input signal frequency of 5.0 MHz and activity ratios for bit 0 of 100%, bit 1 of 50%, bit 2 of 25%, bit 3 of 12.5%, and bit 4 of 6.25%, the D/A converter circuit and the spiking neuron circuit may draw a combined 68 µA at VDD=1.8V, resulting in a total power consumption of 122.4 µW.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above described embodiment, method, and examples, but by all embodiments and methods within the scope and spirit of the invention.

In another embodiment of the invention, a current mirror circuit may be used that is composed of NMOS transistors instead of the PMOS transistors 56, 58, 60, 62, 64, and 66.

What is claimed is:

1. A method of converting a digital signal into a spiking analog signal, comprising:
    applying a different constant current to each of a plurality of switch circuits;
    applying each bit of the digital signal to a corresponding one of the plurality of switch circuits;
    each switch circuit applying the corresponding constant current to a common output when the corresponding bit has a predetermined value and not applying the corresponding constant current to the common output when the corresponding bit does not have the predetermined value; and
    applying a common current at the common output to a spiking neuron circuit.

2. The method of claim 1, wherein each switch circuit applies the corresponding constant current to a sink when the corresponding bit does not have the predetermined value.

3. The method of claim 1, wherein the constant current applied to each switch circuit is double the current applied to the switch circuit corresponding to the next less significant bit in the digital word, except for the switch circuit corresponding to the least significant bit in the digital word.

4. The method of claim 1, wherein the applying the current further comprises:
    charging a capacitor with the current at the common output; and
    discharging the capacitor when a voltage across the capacitor reaches a predetermined value.

5. The method of claim 4, wherein the charging includes continuously applying a charging current to the capacitor as long as all of the bits of the digital signal are not zero.

6. The method of claim 1, wherein the sum of the constant current sources is no more than in the micro-ampere range.

7. A circuit for converting a digital signal into a spiking analog signal, comprising:
    a digital-to-analog converter including a plurality of switch circuits, each switch circuit receiving a different constant current and a corresponding bit of the digital signal, each switch circuit connecting the corresponding constant current to a common output when the corresponding bit has a predetermined value and not applying the corresponding constant current to the common output when the corresponding bit does not have the predetermined value; and
    a spiking neuron circuit having an input connected to the common output.

8. The circuit of claim 7, wherein each switch circuit applies the corresponding constant current to a sink when the corresponding bit does not have the predetermined value.

9. The circuit of claim 7, further comprising a constant current source producing the constant currents, wherein the constant current applied to each switch circuit is double the current applied to the switch circuit corresponding to the next less significant bit in the digital word, expect for the switch circuit corresponding to the least significant bit in the digital signal.

10. The circuit of claim 9, wherein the constant current source comprises a current mirror circuit.

11. The circuit of claim 10, wherein the current mirror circuit includes a plurality of pairs of transistors, each pair of transistors producing a different constant current applied to a corresponding switching circuit, a ratio of width to length of transistors in each pair of transistors corresponding to each switch circuit being double that of the pair of transistors corresponding to the switch circuit receiving the next less significant bit in the digital word, except for the switch circuit receiving the least significant bit of the digital word.

12. The circuit of claim 7, wherein the spiking neuron circuit further comprises:
 a capacitor having a terminal coupled to the common output;
 an amplifier having an input coupled to the terminal of the capacitor; and
 a switch having current conducting terminals connected across the capacitor and a control terminal connected to the output of the amplifier.

13. The circuit of claim 12, wherein the common output continuously provides a current to the capacitor as long as all of the bits of the digital signal are not zero.

14. The circuit of claim 7, wherein the sum of the constant currents is no more than the micro-ampere range.

* * * * *